ns010840204B2

(12) United States Patent
Kawasaki (10) Patent No.: US 10,840,204 B2
(45) Date of Patent: Nov. 17, 2020

(54) SEMICONDUCTOR DEVICE FOR BONDING CONDUCTIVE LAYERS EXPOSED FROM SURFACES OF RESPECTIVE INTERCONNECTION LAYERS

(71) Applicant: Toshiba Memory Corporation, Minato-ku (JP)

(72) Inventor: Atsuko Kawasaki, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/721,202

(22) Filed: Dec. 19, 2019

(65) Prior Publication Data
US 2020/0126941 A1    Apr. 23, 2020

Related U.S. Application Data (60) Continuation of application No. 15/230,125, filed on Aug. 5, 2016, now abandoned, which is a division of
(Continued)

(30) Foreign Application Priority Data

Dec. 11, 2013  (JP) ................................ 2013-256070

(51) Int. Cl.
H01L 23/48    (2006.01)
H01L 23/52    (2006.01)
(Continued)

(52) U.S. Cl.
CPC ............. *H01L 24/24* (2013.01); *H01L 24/03* (2013.01); *H01L 24/05* (2013.01); *H01L 24/08* (2013.01);
(Continued)

(58) Field of Classification Search
CPC ......... H01L 24/03; H01L 24/05; H01L 24/08; H01L 24/19; H01L 24/80; H01L 24/82;
(Continued)

(56) References Cited

U.S. PATENT DOCUMENTS 4,998,665 A    3/1991 Hayashi
5,591,673 A *  1/1997 Chao .................. H01L 21/31116
                                            257/E21.252
(Continued)

FOREIGN PATENT DOCUMENTS

CN    102347243 A    2/2012
JP    2002-26123      1/2002
(Continued)

OTHER PUBLICATIONS

Office Action dated Feb. 17, 2016 in Taiwanese Patent Application No. 103134881 (with English language translation).
(Continued)

*Primary Examiner* — Kimberly N Rizkallah
*Assistant Examiner* — Dilinh P Nguyen
(74) *Attorney, Agent, or Firm* — Oblon, McClelland, Maier & Neustadt, L.L.P.

(57) ABSTRACT

Certain embodiments provide a method for manufacturing a semiconductor device including forming a first interconnection layer having a first conductive layer and a first insulating layer which are exposed from a surface of the first interconnection layer, forming a second interconnection layer having a second conductive layer and a second insulating layer which are exposed from a surface of the second interconnection layer, forming a first non-bonded surface on the surface of the first insulating layer by making a partial area of the surface of the first insulating layer lower than the surface of the first conductive layer, the partial area containing surroundings of the first conductive layer, and con-
(Continued)

necting the surface of the first conductive layer and the surface of the second conductive layer and bonding the surface of the first insulating layer excluding the first non-bonded surface and the surface of the second insulating layer.

4 Claims, 10 Drawing Sheets

Related U.S. Application Data application No. 14/518,389, filed on Oct. 20, 2014, now Pat. No. 9,437,568.

(51) Int. Cl.
| | | |
|---|---|---|
| H01L 29/40 | (2006.01) |
| H01L 23/00 | (2006.01) |
| H01L 25/065 | (2006.01) |
| H01L 25/00 | (2006.01) |
| H01L 21/311 | (2006.01) |

(52) U.S. Cl.
CPC ............ *H01L 24/19* (2013.01); *H01L 24/80* (2013.01); *H01L 24/82* (2013.01); *H01L 25/0657* (2013.01); *H01L 25/50* (2013.01); H01L 21/31144 (2013.01); *H01L 2224/034* (2013.01); *H01L 2224/03616* (2013.01); *H01L 2224/05571* (2013.01); *H01L 2224/05572* (2013.01); *H01L 2224/05647* (2013.01); *H01L 2224/08111* (2013.01); *H01L 2224/08147* (2013.01); *H01L 2224/08148* (2013.01); *H01L 2224/215* (2013.01); *H01L 2224/24146* (2013.01); *H01L 2224/8009* (2013.01); *H01L 2224/80075* (2013.01); *H01L 2224/80201* (2013.01); *H01L 2224/80895* (2013.01); *H01L 2224/80896* (2013.01); *H01L 2224/821* (2013.01); *H01L 2224/96* (2013.01); *H01L 2225/06513* (2013.01); *H01L 2225/06527* (2013.01); *H01L 2924/01013* (2013.01); *H01L 2924/01029* (2013.01); *H01L 2924/05042* (2013.01); *H01L 2924/05442* (2013.01)

(58) Field of Classification Search
CPC ...... H01L 25/0657; H01L 25/50; H01L 24/24; H01L 2924/05442; H01L 2224/215; H01L 2924/01013; H01L 2924/05042; H01L 2924/01029; H01L 2225/06527; H01L 2225/06513; H01L 2224/821; H01L 2224/24146
USPC .......................................... 257/774, 773, 786
See application file for complete search history.

(56) References Cited

U.S. PATENT DOCUMENTS

| | | | |
|---|---|---|---|
| 7,078,811 B2 * | 7/2006 | Suga | ................. H01L 23/49827 257/758 |
| 7,217,631 B2 | 5/2007 | Suga | |
| 8,728,866 B2 | 5/2014 | Kanaya et al. | |
| 8,796,850 B2 | 8/2014 | Tanaka et al. | |
| 8,895,360 B2 | 11/2014 | Chang et al. | |
| 2002/0003307 A1 | 1/2002 | Suga | |
| 2003/0114013 A1 * | 6/2003 | Hedrick | ............ H01L 21/02118 438/734 |
| 2005/0104204 A1 | 5/2005 | Kawakubo et al. | |
| 2005/0170626 A1 | 8/2005 | Suga | |
| 2006/0000639 A1 | 1/2006 | Lauffer | |
| 2011/0062827 A1 | 3/2011 | Ichikawa et al. | |
| 2012/0025366 A1 * | 2/2012 | Kanaya | ................... H01L 21/50 257/693 |
| 2012/0217638 A1 | 8/2012 | Tanaka et al. | |

FOREIGN PATENT DOCUMENTS

| | | |
|---|---|---|
| JP | 2003-309221 | 10/2003 |
| JP | 2006-173457 | 6/2006 |
| JP | 2006-186091 A | 7/2006 |
| JP | 2012-256736 | 12/2012 |
| TW | 201126685 A1 | 8/2011 |

OTHER PUBLICATIONS

Korean Office Action dated Dec. 16, 2015 in Patent Application No. 10-2014-0139847 (with English translation).

* cited by examiner

SEMICONDUCTOR DEVICE FOR BONDING CONDUCTIVE LAYERS EXPOSED FROM SURFACES OF RESPECTIVE INTERCONNECTION LAYERS

CROSS REFERENCE TO RELATED APPLICATIONS

This application is a continuation of and is based upon and claims the benefit of priority under 35 U.S.C. § 120 for U.S. Ser. No. 15/230,125, filed Aug. 5, 2016, which is a divisional of U.S. Ser. No. 14/518,389, filed Oct. 20, 2014, which claims the benefit of priority under 35 U.S.C. § 119 from Japanese Patent Application No. 2013-256070 filed in Japan on Dec. 11, 2013; the entire contents of each of which are incorporated herein by reference.

FIELD

Embodiments described herein relate generally to a semiconductor device.

BACKGROUND

With increasingly higher degrees of integration and functionality of semiconductor integrated circuits in recent years, research on semiconductor devices having a multilayer interconnection layer in which wires are stacked in the vertical direction is under way.

The following method is known as a method for manufacturing a multilayer interconnection layer included in such a type of semiconductor devices. First, a first interconnection layer is formed on a first semiconductor substrate. The first interconnection layer has a surface polished by the CMP (Chemical Mechanical Polishing) method. In the surface, a conductive layer such as a wire or a through hole conductive material, and an insulating layer are exposed. Subsequently, a second interconnection layer is formed on a second semiconductor substrate. The second interconnection layer has a surface polished by the CMP method. In the surface, a conductive layer such as a wire or a through hole conductive material, and an insulating layer are exposed. Next, the surface of the first interconnection layer and the surface of the second interconnection layer are bonded as solid state bonding by applying a pressure welding load to the first semiconductor substrate and the second semiconductor substrate. In this manner, the multilayer interconnection layer is manufactured.

A semiconductor device including the multilayer interconnection layer manufactured as described above is manufactured by solid state bonding of the surface of the first interconnection layer and the surface of the second interconnection layer and therefore, electromagnetic radiation noise can easily be suppressed. Further, the semiconductor device including the multilayer interconnection layer manufactured as described above is manufactured by solid state bonding of through hole conductive materials and therefore, a wire can be made shorter and manufactured easily.

In the above manufacturing method of the semiconductor device, a manufacturing method capable of manufacturing a more reliable semiconductor device by reliably bonding a conductive layer exposed from the surface of the first interconnection layer and a conductive layer exposed from the surface of the second interconnection layer is desired.

DESCRIPTION OF THE EMBODIMENTS

Certain embodiments provide a method for manufacturing a semiconductor device including forming a first interconnection layer on a first substrate, the first interconnection layer having a first conductive layer and a first insulating layer which are exposed from a surface of the first interconnection layer, forming a second interconnection layer on a second substrate, the second interconnection layer having a second conductive layer and a second insulating layer which are exposed from a surface of the second interconnection layer, forming a first non-bonded surface on the surface of the first insulating layer by making a partial area of the surface of the first insulating layer lower than the surface of the first conductive layer, the partial area containing surroundings of the first conductive layer, and electrically connecting the surface of the first conductive layer and the surface of the second conductive layer and also bonding the surface of the first insulating layer excluding the first non-bonded surface and the surface of the second insulating layer.

Certain embodiments provide a semiconductor device including a first interconnection layer including a first conductive layer and a first insulating layer, the first interconnection layer including a first non-bonded surface from which the first conductive layer projects in a convex form, the first non-bonded surface being a partial area of a surface of the first insulating layer and containing the surface of the first insulating layer of a circumference of the first conductive layer, and a second interconnection layer including a second conductive layer and a second insulating layer, the second conductive layer being bonded to the surface of the first conductive layer and the second insulating layer being bonded to the surface of the first insulating layer excluding the first non-bonded surface.

The manufacturing method of a semiconductor device and the semiconductor device according to the embodiments will be described below.

First Embodiment

Figure 1:
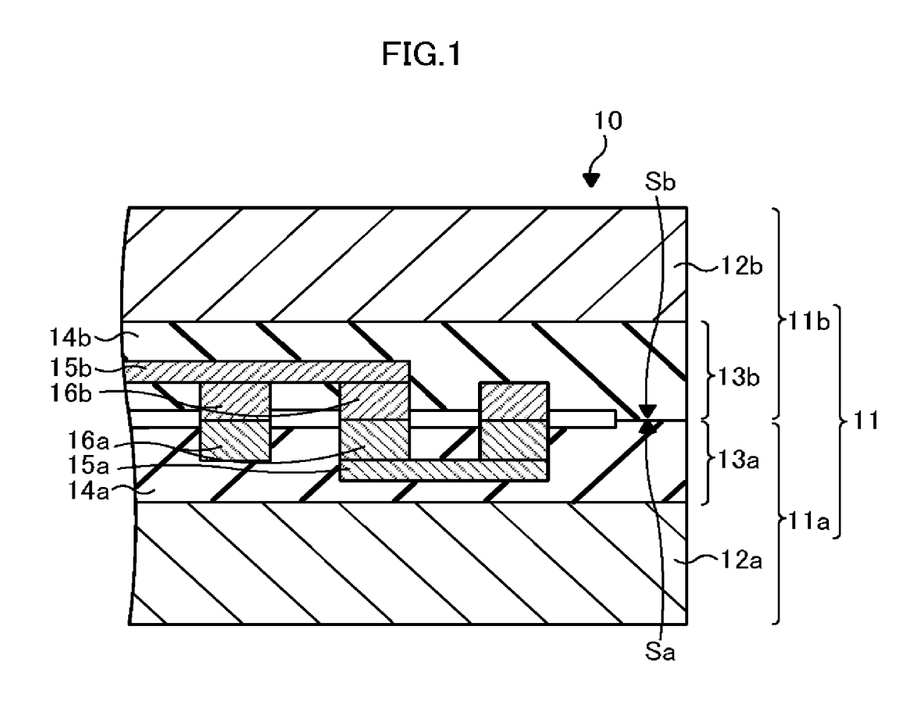
FIG. 1 is a sectional view schematically showing principal portions of a semiconductor device manufactured by a method for manufacturing a semiconductor device according to a first embodiment.

FIG. 1 is a sectional view schematically showing principal portions of a semiconductor device 10 manufactured by a method for manufacturing a semiconductor device according to a first embodiment. The semiconductor device 10 shown in FIG. 1 includes a multilayer interconnection layer 11 formed by mutual solid state bonding of a lower layer portion 11a as a first portion and an upper layer portion 11b as a second portion.

That is, the lower layer portion 11a as the first portion includes a first substrate 12a and a first interconnection layer 13a formed on the first substrate 12a. The first interconnection layer 13a includes a first conductive layer such as a first wire 15a and a first through hole conductive material 16a and a first insulating layer 14a. The first conductive layer is formed inside the first insulating layer 14a. The illustrated first wire 15a is the top layer wire of the first interconnection layer 13a and the first interconnection layer 13a may have a multilayer interconnection structure including the top layer wire 15a.

The first insulating layer 14a as an insulating area and, for example, the first through hole conductive material 16a as a conductive area are exposed from the surface of the first interconnection layer 13a. The insulating area comprised of the first insulating layer 14a is recessed in a portion thereof and the first through hole conductive material 16a as a conductive area is exposed by being projected in a convex form from a recessed area of the insulating area. In the description that follows, the bottom of the recessed area of the first insulating layer 14a will be called a first non-contact surface. The first through hole conductive material 16a projects in a convex form from the first non-contact surface.

A first bonded surface Sa is formed from such an insulating area and a conductive area, that is, the surface of the first insulating layer 14a excluding the first non-contact surface and the top end surface of the first through hole conductive material 16a.

The lower layer portion 11b as the second portion similarly includes a second substrate 12b and a second interconnection layer 13b formed on the second substrate 12b. The second interconnection layer 13b includes a conductive layer such as a second wire 15b and a second through hole conductive material 16b and a second insulating layer 14b. The second conductive layer is inside the second insulating layer 14b. The illustrated second wire 15b is the top layer wire of the second interconnection layer 13b and the second interconnection layer 13b may have a multilayer interconnection structure including the top layer wire 15b.

The second insulating layer 14b as an insulating area and, for example, the second through hole conductive material 16b as a conductive area are exposed from the surface of the second interconnection layer 13b. The insulating area comprised of the second insulating layer 14b is recessed in a portion thereof and the second through hole conductive material 16b as a conductive area is exposed by being projected in a convex form from a recessed area of the insulating area. In the description that follows, the bottom of the recessed area of the second insulating layer 14b will be called a second non-contact surface. The second through hole conductive material 16b projects in a convex form from the second non-contact surface.

A second bonded surface Sb is formed from such an insulating area and a conductive area, that is, the surface of the second insulating layer 14b excluding the second non-contact surface and the top end surface of the second through hole conductive material 16b exposed from the surface of the second insulating layer.

Then, the multilayer interconnection layer 11 of the semiconductor device 10 shown in FIG. 1 is formed by solid state bonding of the first bonded surface Sa of the lower layer portion 11a and the second bonded surface Sb of the upper layer portion 11b and also by solid state bonding of the conductive area (top end surface of the first through hole conductive material 16a) of the first bonded surface Sa of the lower layer portion 11a and the conductive area (top end surface of the second through hole conductive material 16b) of the second bonded surface Sb of the upper layer portion 11b and by a first non-bonded surface of the lower layer portion 11a and a second non-bonded surface of the upper layer portion 11b being mutually spaced. As a result, the lower layer portion 11a and the upper layer portion 11b are bonded such that a space is formed between the first non-bonded surface and the second non-bonded surface.

Though not illustrated, semiconductor devices such as transistors, capacitors and the like are actually formed in each of the lower layer portion 11a and the upper layer portion 11b.

The multilayer interconnection layer 11 as described above is used as, for example, an interconnection layer electrically connecting a sensor unit provided in the upper layer portion 11b to receive light and a logic circuit provided in the lower layer portion 11a to process a signal obtained by the sensor unit.

Figure 6:
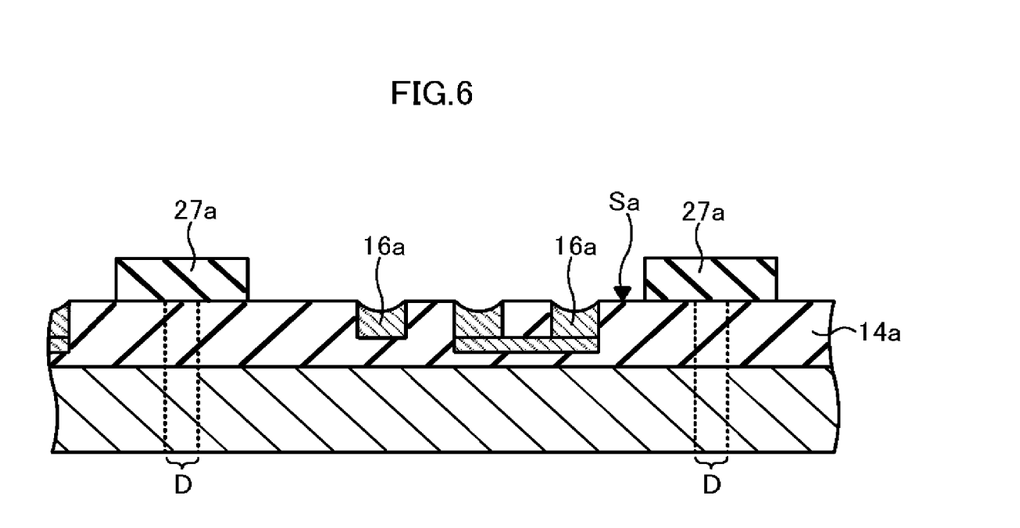
FIG. 6 is a sectional view corresponding to FIG. 1 and illustrating the method for manufacturing the semiconductor device according to the first embodiment.
Figure 7:
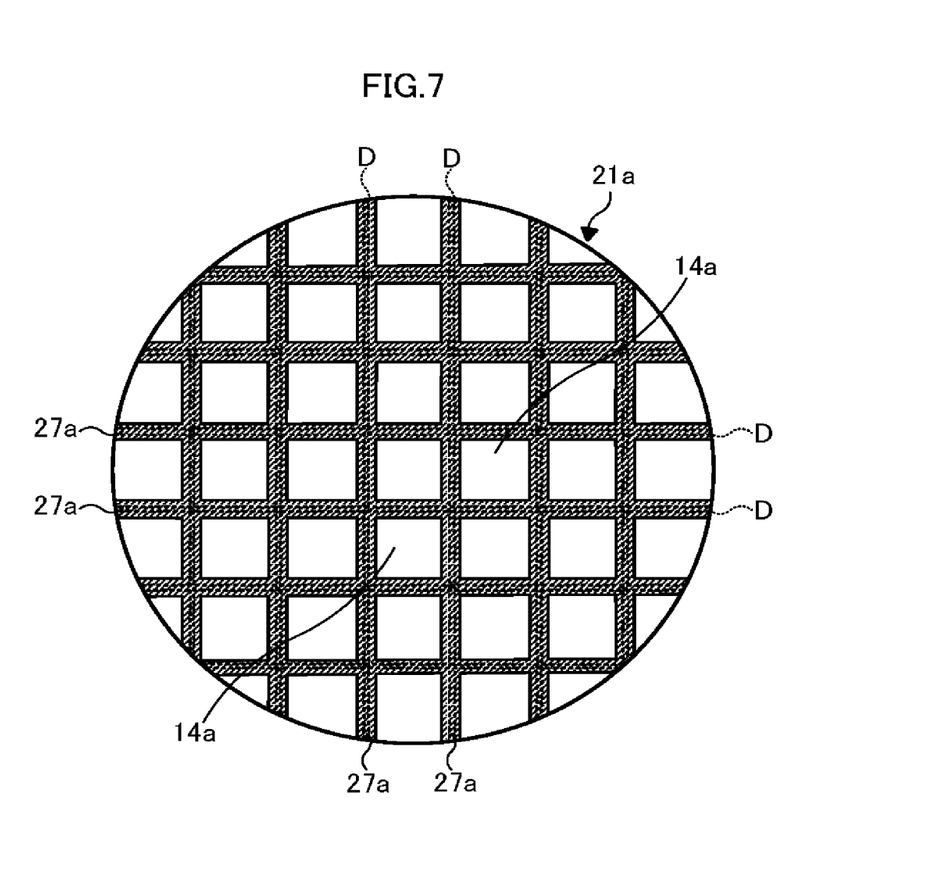
FIG. 7 is a plan view when a first semiconductor wafer in a process shown in FIG. 6 is viewed from above.
Figure 11:
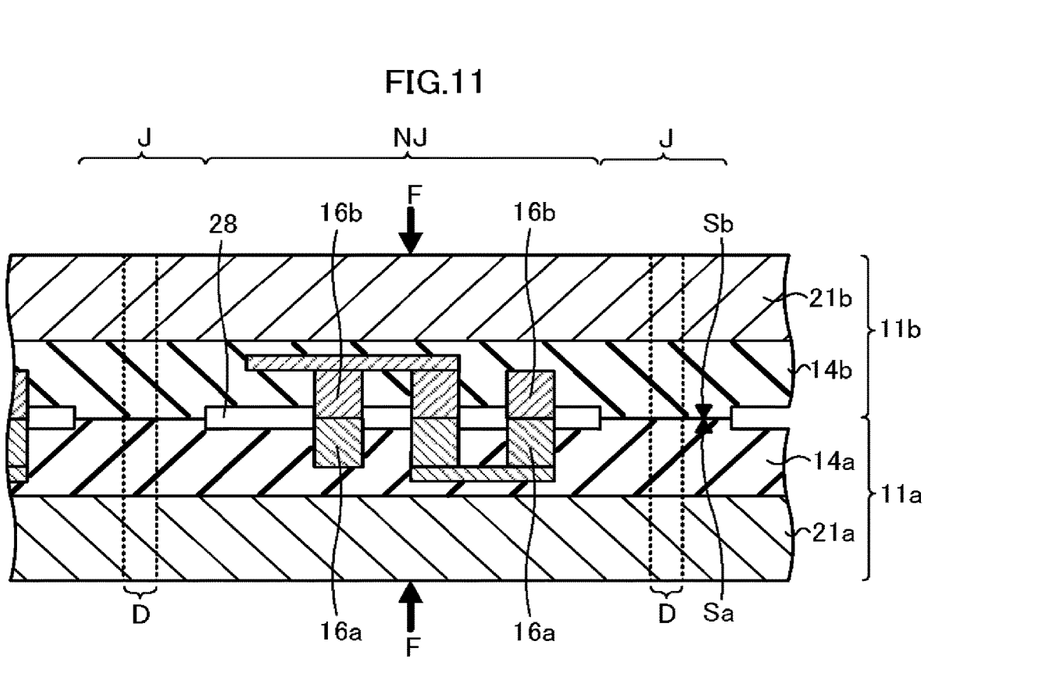
FIG. 11 is a sectional view corresponding to FIG. 1 and illustrating the method for manufacturing the semiconductor device according to the first embodiment.
Figure 12:
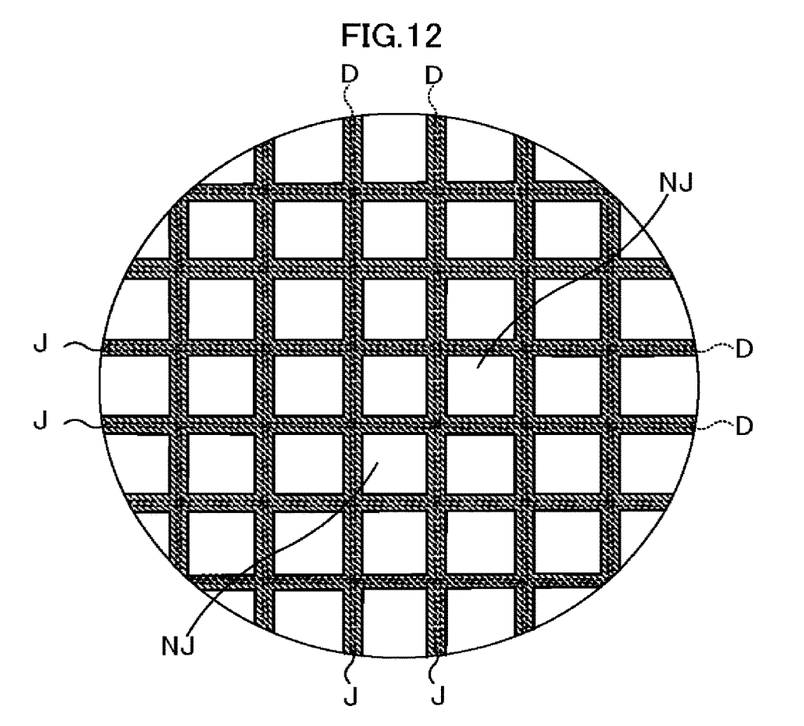
FIG. 12 is a plan view schematically showing a bonded area of a first insulating layer and a second insulating layer and a non-bonded area.

The method for manufacturing the semiconductor device 10 shown in FIG. 1 will be described below with reference to FIGS. 2 to 13. Each of FIGS. 2 to 13 excluding FIGS. 7 and 12 is a sectional view corresponding to FIG. 1 and illustrating the method for manufacturing the semiconductor device 10 according to the first embodiment. FIG. 7 is a plan view when a first semiconductor wafer in a process shown in FIG. 6 is viewed from above and FIG. 12 is a plan view schematically showing a bonded area of a first insulating layer and a second insulating layer and a non-bonded area.

Figure 2:
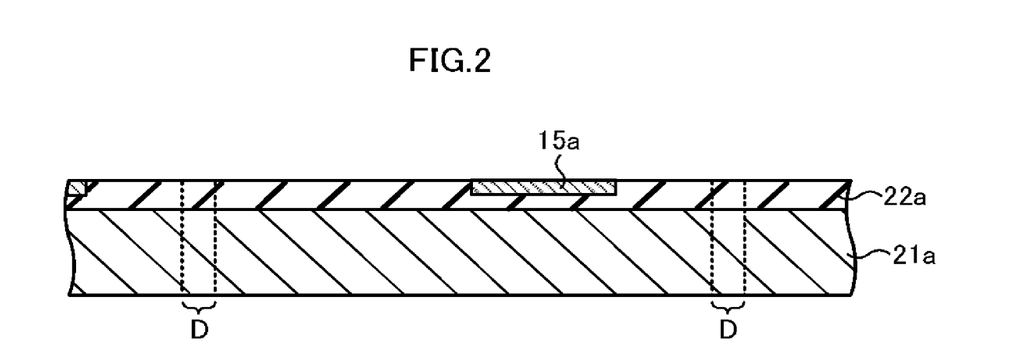
FIG. 2 is a sectional view corresponding to FIG. 1 and illustrating the method for manufacturing the semiconductor device according to the first embodiment.

First, the lower layer portion 11a (FIG. 1) as the first portion will be manufactured. First, as shown in FIG. 2, a first insulating material 22a to be a portion of the first insulating layer 14a (FIG. 1) is formed on the surface of a first semiconductor wafer 21a and the first wire 15a as an example of the conductive layer is formed on the surface of the first insulating material 22a. The first semiconductor wafer 21a is an example of a first wafer to be the first substrate 12a (FIG. 1) later. The first semiconductor wafer 21a is made of silicon or the like and the first wire 15a is made of metal such as copper, aluminum alloy or the like, polysilicon doped with impurities, silicide and the like. The first insulating material 22a is made of silicon oxide, silicon nitride or the like.

An area D between two dotted lines shown in FIG. is a cut area D (dicing line D) cut in a dicing process described later. The first wire 15a described above is actually formed in each area on the surface of the first insulating material 22a partitioned by the grid-like dicing lines D.

Figure 3:
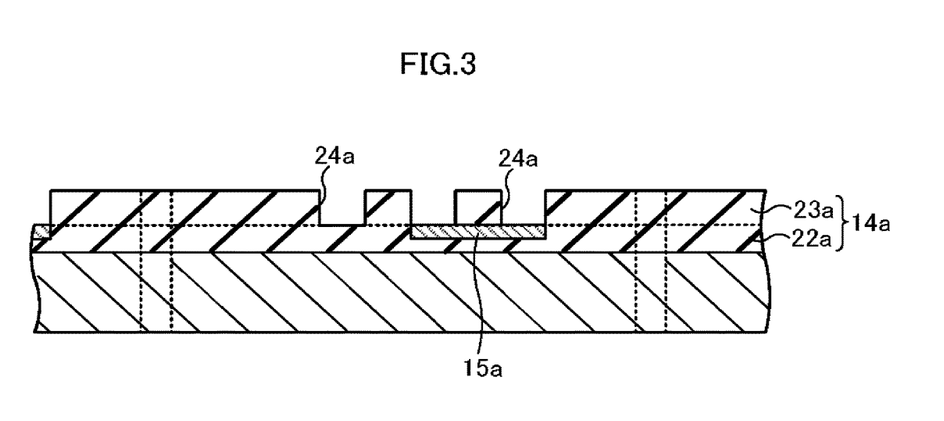
FIG. 3 is a sectional view corresponding to FIG. 1 and illustrating the method for manufacturing the semiconductor device according to the first embodiment.

Next, as shown in FIG. 3, a second insulating material 23a made of silicon oxide, silicon nitride or the like is formed on the surface of the first insulating material 22a including the first wire 15a. Then, a plurality of through holes 24a including through holes reaching the first wire 15a are formed in the second insulating material 23a using technologies of photolithography and dry etching.

Incidentally, the first insulating layer 14a is formed from the above first insulating material 22a and the second insulating material 23a stacked thereon.

Figure 4:
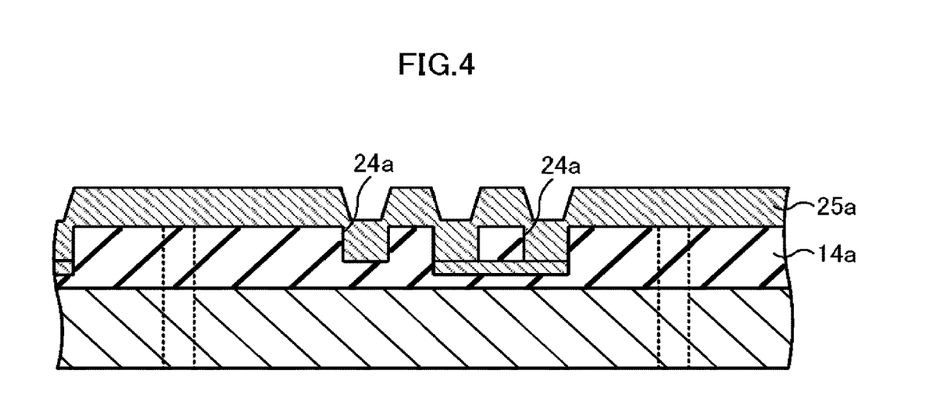
FIG. 4 is a sectional view corresponding to FIG. 1 and illustrating the method for manufacturing the semiconductor device according to the first embodiment.

Next, as shown in FIG. 4, a conductive layer 25a made of, for example, copper is formed such that the whole first insulating layer 14a is covered and the plurality of through holes 24a is all filled.

Figure 5:
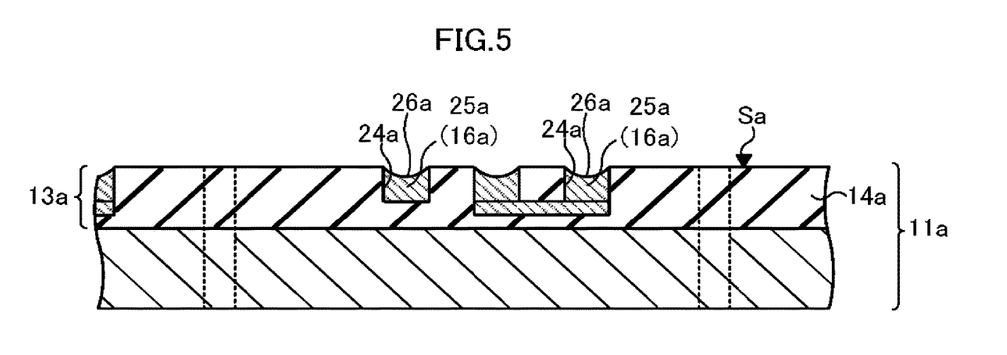
FIG. 5 is a sectional view corresponding to FIG. 1 and illustrating t the method for manufacturing the semiconductor device according to the first embodiment.

Next, as shown in FIG. 5, the conductive layer 25a is polished by the CMP method until the surface of the first insulating layer 14a is exposed to planarize the surface of the first insulating layer 14a including the conductive layer 25a. The conductive layer 25a filling the through hole 24a becomes the first through hole conductive material 16a by this process.

The top end surface of the first through hole conductive material 16a and the surface of the first insulating layer 14a are substantially planarized in this process, but the first through hole conductive material 16a made of copper or the like has hardness lower than that of the first insulating layer 14a made of silicon oxide, silicon nitride or the like and therefore, the surface of the first through hole conductive material 16a is dented like a dish and becomes lower than the surface of the first insulating layer 14a by CMP. That is, a dishing portion 26a dented like a dish is formed on the top end surface of the first through hole conductive material 16a.

By the above process, the first bonded surface Sa including the insulating area where the first insulating layer 14a is exposed on the surface of the first interconnection layer 13a of the lower layer portion 11a as the first portion and the conductive area where the top end surface (dishing portion 26a) of the first through hole conductive material 16a is exposed is formed.

Next, as shown in FIG. 6, a resist layer 27a is formed on the dicing line D and the periphery thereof (that is, on the surface of the periphery of the first insulating layer 14a) in the insulating area exposed from the first bonded surface Sa. The resist layer 27a is formed by applying a resist material to the surface of the first insulating layer 14a including the surface of the first through hole conductive material 16a and removing an unnecessary portion of the resist material after undergoing exposure and development processes.

Here, as shown in FIG. 7, the dicing line D is generally formed like a grid for the first semiconductor wafer 21a. Thus, the formed resist layer 27a is similarly formed like a grid on the surface of the first insulating layer 14a formed on the first semiconductor wafer 21a. Actually, in addition to the first insulating layer 14a, the first through hole conductive material 16a is also exposed from the area surrounded by the resist layer 27a, but the first through hole conductive material is omitted in FIG. 7.

Figure 8:
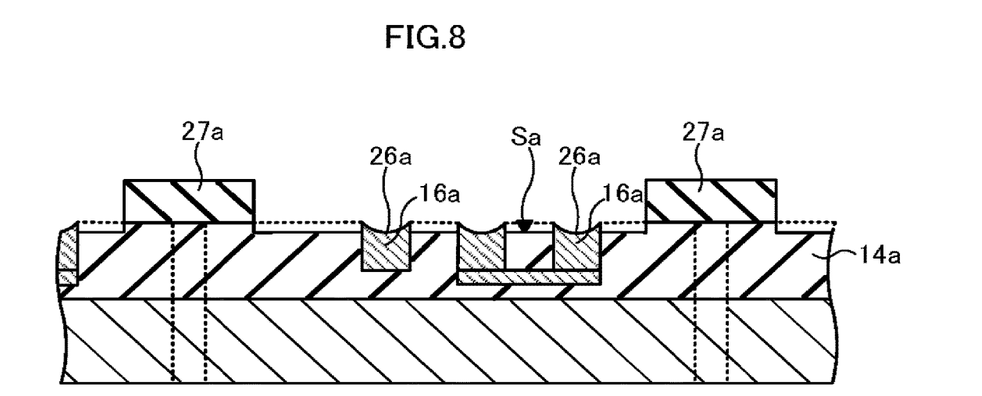
FIG. 8 is a sectional view corresponding to FIG. 1 and illustrating the method for manufacturing the semiconductor device according to the first embodiment.

Next, as shown in FIG. 8, the first insulating layer 14a is selectively etched by the reactive ion etching method until the height of the surface of the center portion of the first insulating layer 14a exposed from the resist layer 27a (insulating area of the first bonded surface Sa exposed from the resist layer 27a) is substantially as high as the bottom of the dishing portion 26a of the first through hole conductive material 16a. The reactive ion etching is selective and also anisotropic and therefore, the height of the surface of the center portion of the first insulating layer 14a can be made substantially equal to the height of the bottom of the dishing portion 26a by microprocessing of the first insulating layer 14a.

By this process, the height of the center portion as a partial area containing the surroundings of each of the first through hole conductive materials 16a of the insulating area of the first bonded surface Sa falls below the top end surface of each of the first through hole conductive materials 16a as the conductive area and a first non-bonded surface as the bottom of a concave area is formed in a partial area of the insulating area of the first bonded surface Sa. Then, each of the first through hole conductive materials 16a projects from the first non-bonded surface in a convex form.

In the etching process, the first through hole conductive material 16a only needs to project from the surface (first non-bonded surface) of the surrounding first insulating layer 14a in a convex form. Therefore, etching may be performed such that the height of the surface of the first insulating layer 14a exposed from the resist layer 27a becomes, for example, lower than the bottom of the dishing portion 26a of the first through hole conductive material 16a.

Figure 9:
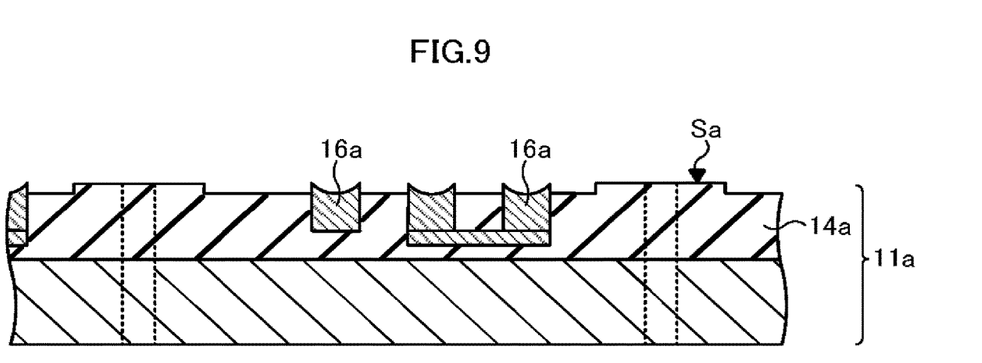
FIG. 9 is a sectional view corresponding to FIG. 1 and illustrating the method for manufacturing the semiconductor device according to the first embodiment.

Lastly, as shown in FIG. 9, the resist layer 27a is removed by, for example, asking. In this manner, the lower layer portion 11a of the semiconductor device 10 including the first bonded surface Sa constituted of the insulating area formed of the surface of the first insulating layer 14a excluding the first non-bonded surface and the conductive area formed of the top end surface of the first through hole conductive material 16a projecting from the first non-bonded surface in a convex form is formed.

Figure 10:
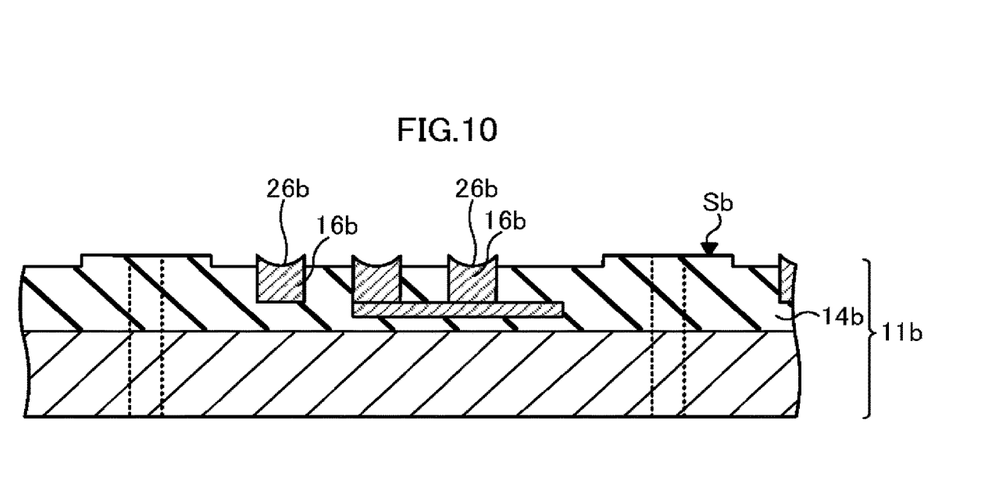
FIG. 10 is a sectional view corresponding to FIG. 1 and illustrating the method for manufacturing the semiconductor device according to the first embodiment.

Subsequently, as shown in FIG. 10, the upper layer portion 11b of the semiconductor device 10 including the second bonded surface Sb constituted of the insulating area formed of the surface of the second insulating layer 14b excluding the second non-bonded surface and the conductive area formed of the top end surface of the second through hole conductive material 16*b* projecting from the second non-bonded surface in a convex form is formed. In the formed upper layer portion 11*b*, a dishing portion 26*b* is formed on the top end surface of the second through hole conductive material 16*b*.

Next, the first bonded surface Sa of the lower layer portion 11*a* and the second bonded surface Sb of the upper layer portion 11*b* are surface-treated. That is, the first and second bonded surfaces Sa, Sb are activated. Then, as shown in FIG. 11, the lower layer portion 11*a* and the upper layer portion 11*b* are arranged opposite to each other in a vacuum or in an atmosphere of an inert gas such that a space 28 is formed between the first non-bonded surface and the second non-bonded surface and also the insulating area of the first bonded surface Sa and the insulating area of the second bonded surface Sb are matched and the conductive area of the first bonded surface Sa and the conductive area of the second bonded surface Sb are matched. Then, solid state bonding of the first through hole conductive material 16*a* and the second through hole conductive material 16*b* is caused and also a hydrogen bond of the periphery of the first insulating layer 14*a* and that of the second insulating layer 14*b* are caused by applying pressure welding loads F, F to the first semiconductor wafer 21*a* of the lower layer portion 11*a* and a second semiconductor wafer 21*b* of the upper layer portion 11*b* under a low temperature condition of about, for example, 150° C. Then, the bonded semiconductor wafers 21*a*, 21*b* are heat-treated at about, for example, 400° C. In this manner, the first through hole conductive material 16*a* and the second through hole conductive material 16*b* are bonded by a metallic bond and the first insulating layer 14*a* and the second insulating layer 14*b* are bonded by a covalent bond. Because the conductive area of the first bonded surface Sa is convex with respect to the insulating area of the first bonded surface Sa in the surroundings and also the conductive area of the second bonded surface Sb is convex with respect to the insulating area of the second bonded surface Sb in the surroundings, solid state bonding of the first through hole conductive material 16*a* and the second through hole conductive material 16*b* constituting the conductive areas of both can reliably be achieved. Then, a portion of the first through hole conductive material 16*a* and a portion of the second through hole conductive material 16*b* that are bonded to each other by solid state bonding are arranged inside the space 28.

As shown in FIGS. 11 and 12, a bonded area J where the periphery of the first insulating layer 14*a* and that of the second insulating layer 14*b* are bonded by a covalent bond is provided like a grid along the dicing line D. That is, a non-bonded area NJ including the first non-contact surface of the first insulating layer 14*a* and the second non-contact surface of the second insulating layer 14*b* becomes an area surrounded by the bonding areas J of both.

Figure 13:
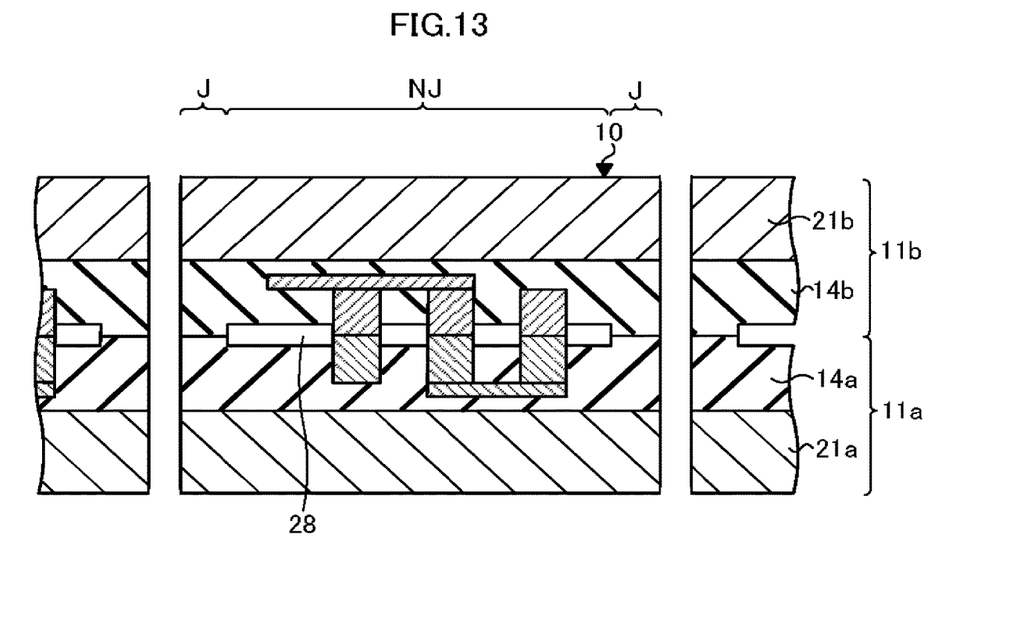
FIG. 13 is a sectional view corresponding to FIG. 1 and illustrating the method for manufacturing the semiconductor device according to the first embodiment.

Lastly, as shown in FIG. 13, the lower layer portion 11*a* and the upper layer portion 11*b* are cut along the dicing line D. That is, the first semiconductor wafer 21*a*, the first insulating layer 14*a*, the second insulating layer 14*b*, and the second semiconductor wafer 21*b* on the dicing line D are cut. Accordingly, a plurality of the semiconductor devices 10 is manufactured collectively. In the semiconductor device 10 manufactured as described above, the space 28 is formed in the non-bonded area NJ of the first insulating layer 14*a* and the second insulating layer 14*b* and the space 28 is surrounded by the bonding areas J of the first insulating layer 14*a* and the second insulating layer 14*b*.

In the method for manufacturing the semiconductor device 10 and the semiconductor device 10 according to an embodiment, as described above, the first through hole conductive material 16*a* as a conductive layer of the lower layer portion 11*a* is projected from the first non-contact surface provided in the surrounding first insulating layer 14*a* in a convex form and also the second through hole conductive material 16*b* as a conductive layer of the upper layer portion 11*b* is projected from the second non-contact surface provided in the surrounding second insulating layer 14*b* in a convex form and then, these through hole conductive materials are bonded by solid state bonding. Thus, even if the dishing portion 26*a* is formed on the top end surface of the first through hole conductive material 16*a* by the CMP method and the dishing portion 26*b* is formed on the top end surface of the second through hole conductive material 16*b*, these through hole conductive materials can reliably be bonded. Therefore, electric bonding of the first through hole conductive material 16*a* and the second through hole conductive material 16*b* can reliably be achieved and the semiconductor device 10 superior in reliability can be manufactured.

Also in the method for manufacturing the semiconductor device 10 and the semiconductor device 10 according to an embodiment, when the lower layer portion 11*a* and the upper layer portion 11*b* are bonded, the periphery surface of the first insulating layer 14*a* of the lower layer portion 11*a* and the periphery surface of the second insulating layer 14*b* of the upper layer portion 11*b* are bonded by solid state bonding. Then, the first through hole conductive material 16*a* and the second through hole conductive material 16*b* are mutually bonded by solid state bonding inside the non-bonded area NJ (inside the space 28 between the first non-contact surface and the second non-contact surface) surrounded by the bonded areas J of the first insulating layer 14*a* and the second insulating layer 14*b*. Thus, in the manufactured semiconductor device 10, the first through hole conductive material 16*a* and the second through hole conductive material 16*b* mutually bonded by solid state bonding are arranged in the space 28 so as to be surrounded by the bonded areas J of the first insulating layer 14*a* and the second insulating layer 14*b*. Therefore, defects of the first through hole conductive material 16*a* and the second through hole conductive material 16*b* by intrusion of a chemical from outside the semiconductor device 10 can be suppressed from arising.

Further, in the method for manufacturing the semiconductor device 10 and the semiconductor device 10 according to an embodiment, the area D cut in the dicing process as the final process is the bonded area J where the first insulating layer 14*a* and the second insulating layer 14*b* are bonded by a covalent bond. Thus, in the dicing process, the first insulating layer 14*a* and the second insulating layer 14*b* are also suppressed from being damaged (chipped).

In the method for manufacturing the semiconductor device 10 and the semiconductor device 10 according to an embodiment, as described above, defects of the first through hole conductive material 16*a* and the second through hole conductive material 16*b* by intrusion of a chemical are suppressed from arising and also the first insulating layer 14*a* and the second insulating layer 14*b* are suppressed from being damaged (chipped) in the dicing process. Therefore, the semiconductor device 10 more superior in reliability can be manufactured with high yields.

Further, in the method for manufacturing the semiconductor device 10 and the semiconductor device according to an embodiment, the surface of the first insulating layer 14*a* of the lower layer portion 11a and the surface of the second insulating layer 14b of the upper layer portion 11b are bonded by a covalent bond and thus, the lower layer portion 11a and the upper layer portion 11b are bonded strongly. Therefore, the semiconductor device 10 more superior in reliability can be manufactured.

Figure 14:
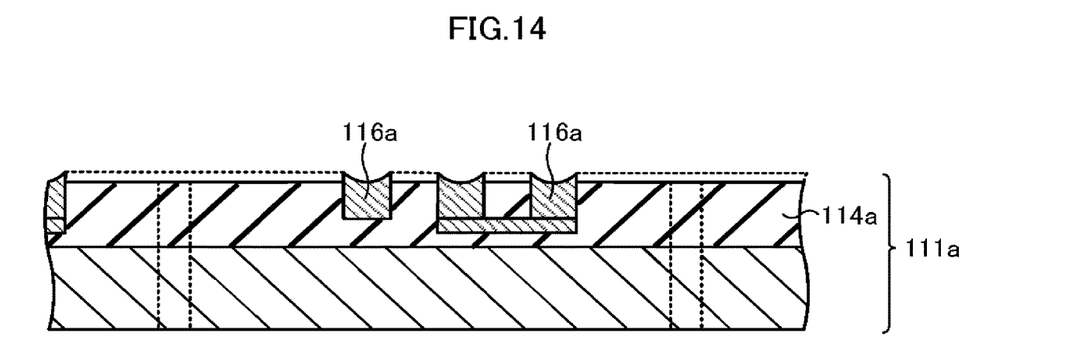
FIG. 14 is a sectional view illustrating the method for manufacturing a semiconductor device according to a comparative example.
Figure 15:
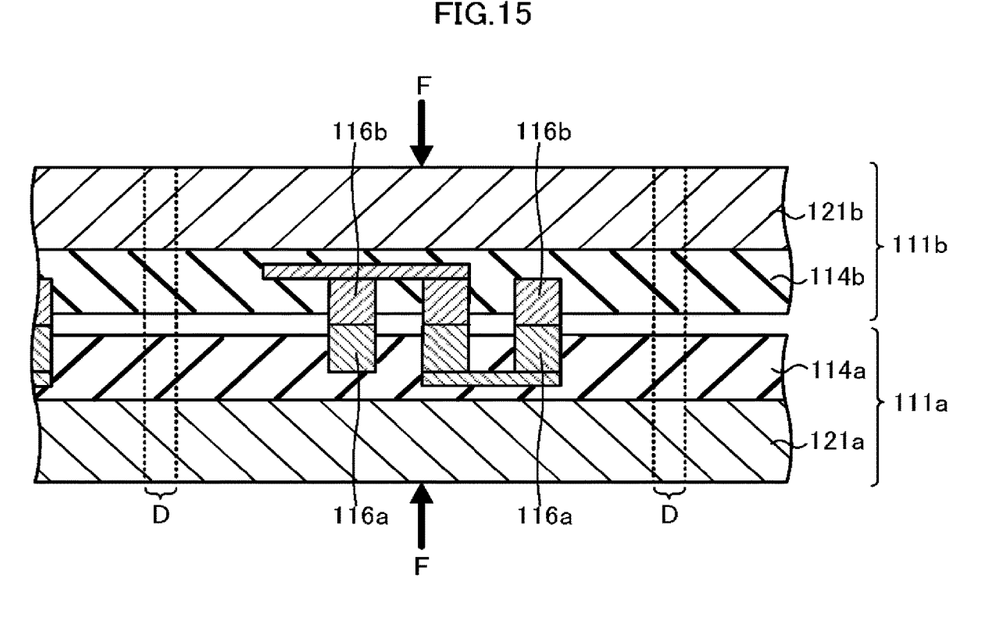
FIG. 15 is a sectional view illustrating the method for manufacturing the semiconductor device according to the comparative example.
Figure 16:
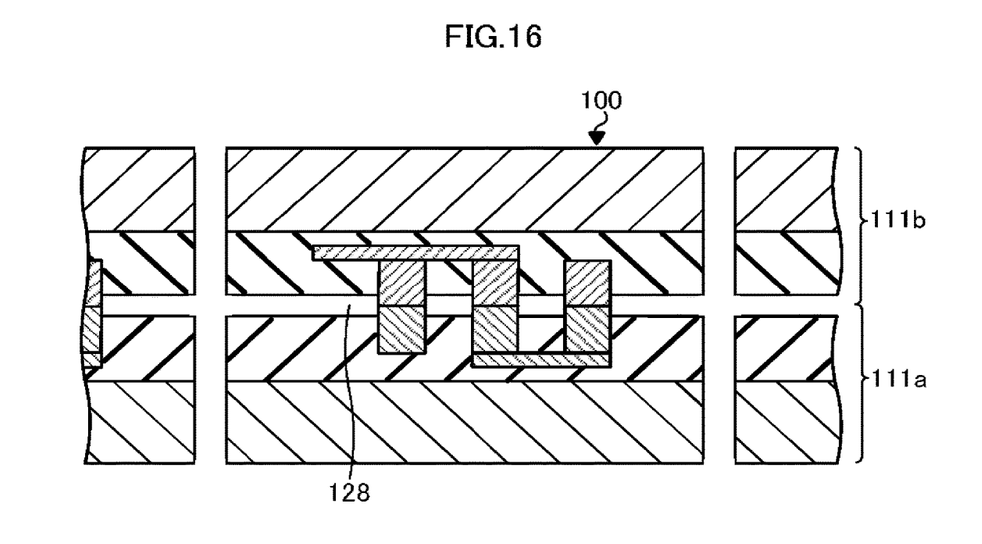
FIG. 16 is a sectional view illustrating the method for manufacturing the semiconductor device according to the comparative example.

In contrast, a method for manufacturing a semiconductor device simply capable of reliably bonding a first through hole conductive material and a second through hole conductive material will be described as a comparative example of the method for manufacturing the semiconductor device according to the present embodiment with reference to FIGS. 14 to 16. Each of FIGS. 14 to 16 is a sectional view illustrating the method for manufacturing a semiconductor device according to the comparative example. In FIGS. 14 to 16, the same reference numerals are attached to the same portions as those in the present embodiment.

In the method for manufacturing a lower layer portion 111a of a semiconductor device according to the comparative example, the surface of a first insulating layer 114a where a first through hole conductive material 116a is exposed is planarized by the CMP method after undergoing each process shown in FIGS. 2 to 5 and then, as shown in FIG. 14, the whole surface of a first insulating layer 114a is etched without forming a resist layer on the surface of the first insulating layer 114a to project the first through hole conductive material 116a in a convex form.

Also in the manufacture of an upper layer portion 111b, though an illustration thereof is omitted, the surface of a second insulating layer 114b where a second through hole conductive material 116b is exposed is planarized by the CMP method and then, the whole surface of a second insulating layer 114b is etched without forming a resist layer on the surface of the second insulating layer 114b to project the second through hole conductive material 116b in a convex form.

Thereafter, the surface of the lower layer portion 111a where the first through hole conductive material 116a projects from the first insulating layer 114a in a convex form and the surface of the upper layer portion 111b where the second through hole conductive material 116b projects from the second insulating layer 114b in a convex form are made clean surfaces by cleaning in a vacuum and then, as shown in FIG. 15, the lower layer portion 111a and the upper layer portion 111b are arranged opposite to each other such that the first through hole conductive material 116a and the second through hole conductive material 116b are matched in a vacuum or in an atmosphere of an inert gas. Then, the first through hole conductive material 116a and the second through hole conductive material 116b are bonded by solid state bonding by applying pressure welding loads F, F to a first semiconductor wafer 121a of the lower layer portion 111a and a second semiconductor wafer 121b of the upper layer portion 111b.

Then, as shown in FIG. 16, the lower layer portion 111a and the upper layer portion 111b are cut along the dicing line D in the final process to manufacture a plurality of semiconductor devices 100 together.

Also in the method for manufacturing the semiconductor device 100 according to the comparative example as described above, the first through hole conductive material 116a as a conductive layer of the lower layer portion 111a is projected from the surrounding first insulating layer 114a in a convex form and also the second through hole conductive material 116b as a conductive layer of the upper layer portion 111b is projected from the surrounding second insulating layer 114b in a convex form and then, these through hole conductive materials are bonded by solid state bonding. Therefore, the first through hole conductive material 116a and the second through hole conductive material 116b can reliably be bonded.

However, in the semiconductor device 100 manufactured as described above, as shown in FIG. 16, a gap 128 is formed between the first insulating layer 114a and the second insulating layer 114b. Then, the gap 128 is exposed from the side face of the device 100. Therefore, defects of the first through hole conductive material 116a and the second through hole conductive material 116b are caused by intrusion of a chemical from outside the semiconductor device 100. Therefore, when compared with the semiconductor device 10 manufactured by the method for manufacturing the semiconductor device according to the present embodiment, the semiconductor device 100 manufactured by the manufacturing method according to the comparative example is inferior in reliability. Further, because the gap 128 arises between the first insulating layer 114a and the second insulating layer 114b on the dicing line D, the first insulating layer 114a or the second insulating layer 114b may be damaged (chipped) when the first insulating layer 114a and the second insulating layer 114b are cut along the dicing line D. Therefore, when compared with the semiconductor device 10 manufactured by the method for manufacturing the semiconductor device according to the present embodiment, the semiconductor device 100 manufactured by the manufacturing method according to the comparative example is inferior in reliability and also manufacturing yields decrease.

That is, according to the method for manufacturing the semiconductor device 10 according to the present embodiment, when compared with the manufacturing method of the semiconductor device 100 according to the comparative example, semiconductor devices more superior in reliability can be manufactured with high yields.

In the method for manufacturing the semiconductor device 10 and the semiconductor device according to the first embodiment, the first through hole conductive material 16a of the lower layer portion 11a is projected from the surrounding first insulating layer 14a (first non-contact surface) in a convex form and also the second through hole conductive material 16b of the upper layer portion 11b is projected from the surrounding second insulating layer 14b (second non-contact surface) in a convex form and then, these through hole conductive materials are bonded by solid state bonding. However, both through hole conductive materials may reliably be bonded by solid state bonding by projecting only one of through hole conductive materials from the surrounding insulating layer in a convex form without the need to project the other through hole conductive material from the surrounding insulating layer. Hereinafter, the manufacturing method will be described.

Second Embodiment

A method for manufacturing the semiconductor device according to the second embodiment will be described below with reference to FIGS. 17 to 20. Each of FIGS. 17 to 20 is a sectional view illustrating the method for manufacturing the semiconductor device according to the second embodiment. In each figure, the same reference signs are attached to the same portions as those of a semiconductor device according to the first embodiment.

Figure 17:
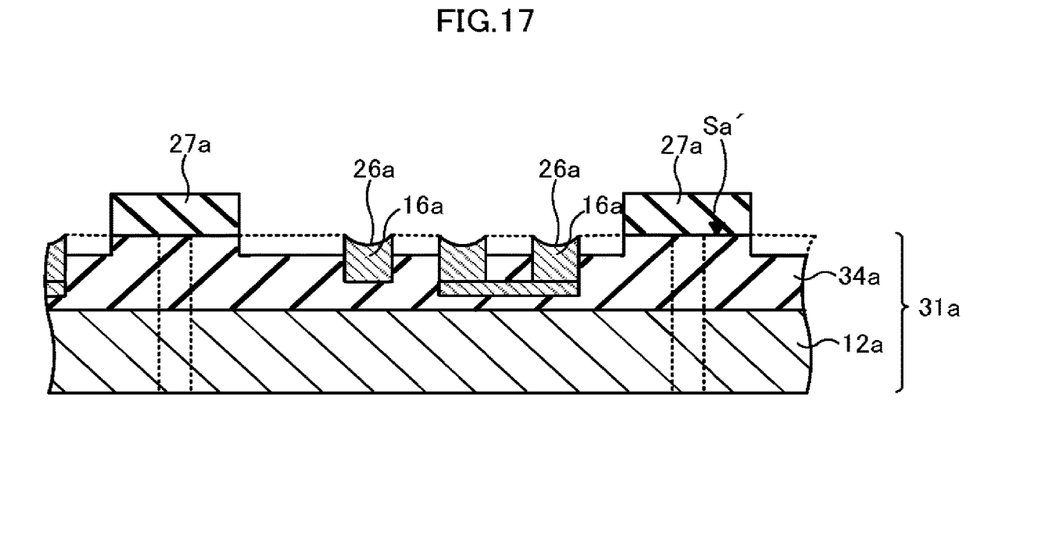
FIG. 17 is a sectional view illustrating a method for manufacturing the semiconductor device according to a second embodiment.

According to this manufacturing method, in a lower layer portion 31a as a first portion, after a resist layer 27a is formed on the surface of a first insulating layer 34a by undergoing each process shown in FIGS. 2 to 7, as shown in FIG. 17, the first insulating layer 34a exposed from the resist layer 27a is etched. The etching is performed until the first insulating layer 34a is as high as the bottom of the dishing portion 26a of the first through hole conductive material 16a or becomes lower. Accordingly, a first non-contact surface is formed on the surrounding first insulating layer 34a of the first through hole conductive material 16a.

Then, after such an etching process being performed, the resist layer 27a is removed. The first through hole conductive material 16a projects in a big way from the surface (first non-contact surface) of the first insulating layer 34a after the resist layer 27a being removed. An insulating area made of the surface of the first insulating layer 34a excluding such a first non-contact surface and a conductive area made of the top end surface of the first through hole conductive material 16a become a first bonded surface Sa'.

Figure 18:
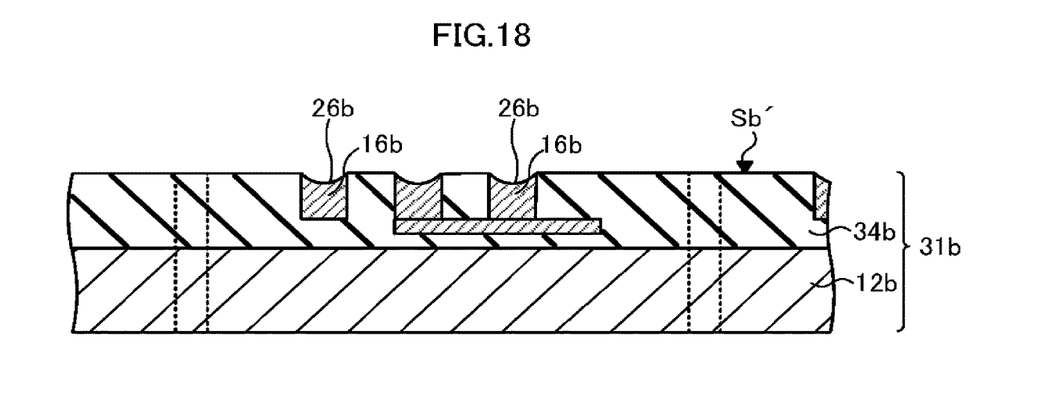
FIG. 18 is a sectional view illustrating the method for manufacturing the semiconductor device according to the second embodiment.

On the other hand, in an upper layer portion 31b as a second portion, as shown in FIG. 18, the conductive layer (conductive layer to become the second through hole conductive material 16b) is polished by the CMP method until the surface of a second insulating layer 34b is exposed to planarize the surface of the second insulating layer 34b where the second through hole conductive material 16b is exposed. Then, an insulating area made of the surface of the second insulating layer 34b in this state and a conductive area made of the top end surface of the second through hole conductive material 16b become a second bonded surface Sb'.

Figure 19:
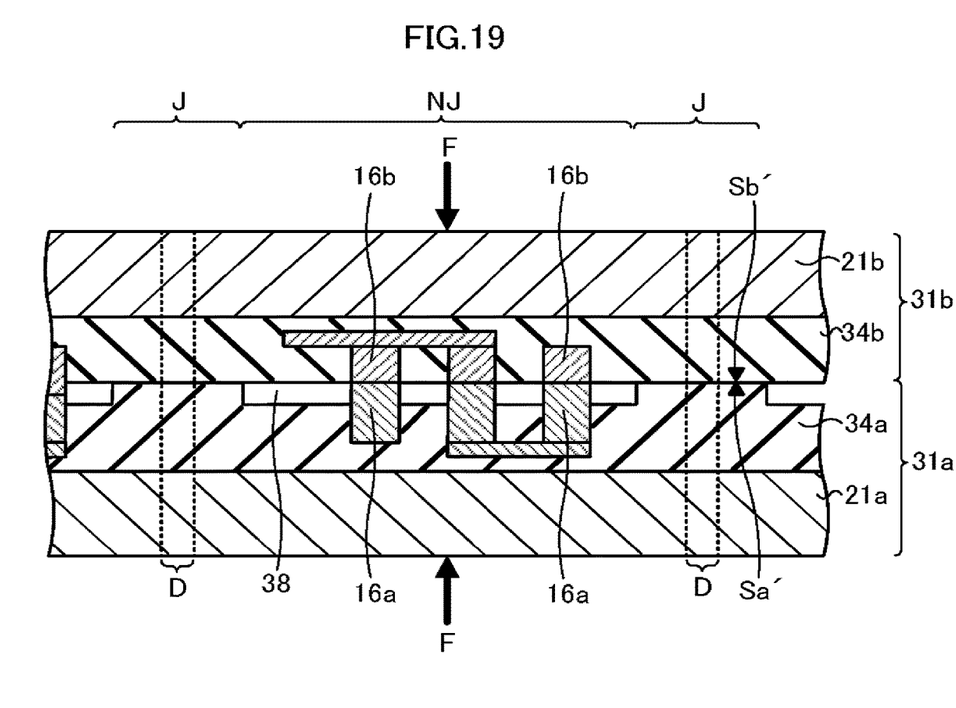
FIG. 19 is a sectional view illustrating the method for manufacturing the semiconductor device according to the second embodiment.

After the first and second bonded surfaces Sa', Sb' being formed as described above, these bonded surfaces Sa', Sb' are surface-treated. That is, the first and second bonded surfaces Sa', Sb' are activated. Then, as shown in FIG. 19, the lower layer portion 31a and the upper layer portion 31b are arranged opposite to each other such that a space 38 is formed between the first non-bonded surface Sa' and the second non-bonded surface Sb' and also the insulating area of the first bonded surface Sa' and the insulating area of the second bonded surface Sb' are matched and the conductive area of the first bonded surface Sa' and the conductive area of the second bonded surface Sb' are matched in a vacuum or in an atmosphere of an inert gas. Then, solid state bonding of the first through hole conductive material 16a and the second through hole conductive material 16b is caused and also a hydrogen bond of the periphery of the first insulating layer 34a and that of the second insulating layer 34b are caused by applying the pressure welding loads F, F to the first semiconductor wafer 21a of the lower layer portion 31a and a second semiconductor wafer 21b of the upper layer portion 31b under a low temperature condition of about, for example, 150° C. Then, the bonded semiconductor wafers 21a, 21b are heat-treated at about, for example, 400° C. In this manner, the first through hole conductive material 16a and the second through hole conductive material 16b are bonded by a metallic bond and the first insulating layer 34a and the second insulating layer 34b are bonded by a covalent bond. Because the conductive area of the first bonded surface Sa' is convex with respect to the insulating area of the first bonded surface Sa' in the surroundings, solid state bonding of the first through hole conductive material 16a constituting the conductive area of the first bonded surface Sa' and the second through hole conductive material 16b constituting the conductive area of the second bonded surface Sb' can reliably be achieved. Then, a portion of the first through hole conductive material 16a and a portion of the second through hole conductive material 16b are bonded to each other by solid state bonding are arranged inside the space 38.

Figure 20:
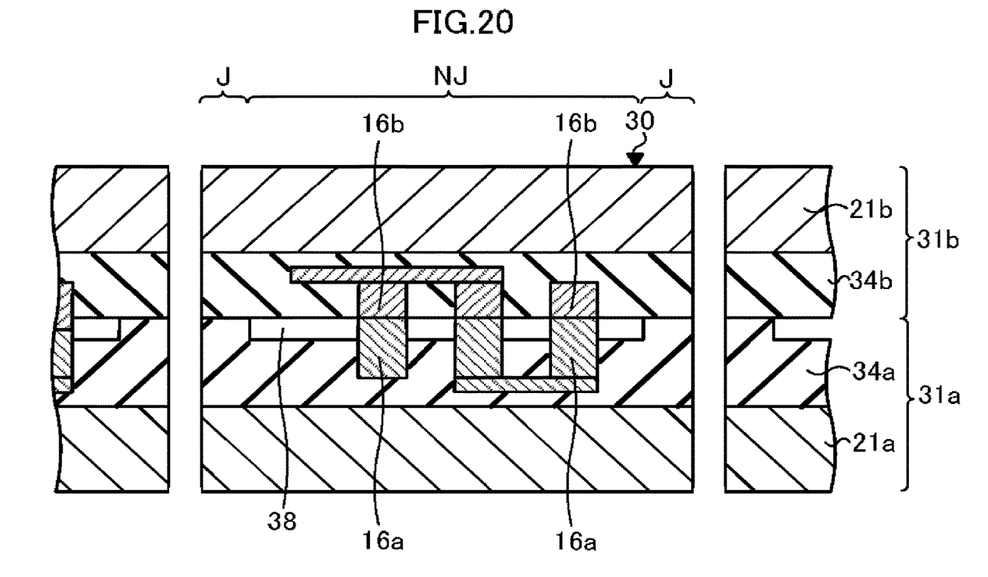
FIG. 20 is a sectional view illustrating the method for manufacturing the semiconductor device according to the second embodiment.

Then, as shown in FIG. 20, the lower layer portion 31a and the upper layer portion 31b are cut along the dicing line D in the final process. Accordingly, a plurality of semiconductor devices 30 is manufactured collectively. In the semiconductor device 30 manufactured as described above, the space 38 is formed in the non-bonded area NJ of the first insulating layer 34a and the second insulating layer 34b and the space 38 is surrounded by the bonding areas J of the first insulating layer 34a and the second insulating layer 34b.

In the method for manufacturing the semiconductor device 30 and the semiconductor device 30 according to the second embodiment described above, after the first through hole conductive material 16a as a conductive layer of the lower layer portion 31a being projected from the first non-contact surface provided in the surrounding first insulating layer 34a in a convex form, the first through hole conductive material 16a and the second through hole conductive material 16b slightly dented and made lower than the surface of the second insulating material 34b with the dishing portion 26b formed thereon are bonded by solid state bonding. Thus, even if the dishing portions 26a, 26b are formed on the top end surface of the first through hole conductive material 16a and the top end surface of the second through hole conductive material 16b by the CMP method, these through hole conductive materials can reliably be bonded. Therefore, electric bonding of the first through hole conductive material 16a and the second through hole conductive material 16b can reliably be achieved and the semiconductor device 30 superior in reliability can be manufactured.

Also in the method for manufacturing the semiconductor device 30 and the semiconductor device 30 according to an embodiment, when the lower layer portion 31a and the upper layer portion 31b are bonded, the periphery surface of the first insulating layer 34a of the lower layer portion 31a and the periphery surface of the second insulating layer 34b of the upper layer portion 31b are bonded by solid state bonding. Then, the first through hole conductive material 16a and the second through hole conductive material 16b are mutually bonded by solid state bonding inside the non-bonded area NJ (inside the space 38 between the first insulating layer 34a and the second insulating layer 34b) surrounded by the bonded areas J of the first insulating layer 34a and the second insulating layer 34b. Thus, in the manufactured semiconductor device 30, the first through hole conductive material 16a and the second through hole conductive material 16b mutually bonded by solid state bonding are arranged in the space 38 so as to be surrounded by the bonded areas J of the first insulating layer 34a and the second insulating layer 34b. Therefore, defects of the first through hole conductive material 16a and the second through hole conductive material 16b by intrusion of a chemical from outside the semiconductor device 30 can be suppressed from arising and at the same time, in the dicing process, the first insulating layer 34a and the second insulating layer 34b are also suppressed from being damaged (chipped). Therefore, when compared with the semiconductor device 100 manufactured by the manufacturing method according to the comparative example described above, the semiconductor device 30 more superior in reliability can be manufactured with high yields.

In the method for manufacturing the semiconductor device 30 and the semiconductor device according to the second embodiment, the first through hole conductive material 16a is projected by only a partial area of the first insulating layer 34a of the lower layer portion 31a as the first portion being selectively etched and the second through hole conductive material 16b is not projected without the second insulating layer 34b of the upper layer portion 31b as the second portion being selectively etched, but the first portion may be set as the upper layer portion 31b and the second portion may be set as the upper layer portion 31a. That is, the second through hole conductive material 16b may be projected by only a partial area of the second insulating layer 34b of the upper layer portion 31b being selectively etched and the first through hole conductive material 16a may not be projected without the first insulating layer 34a of the lower layer portion 31a being selectively etched. Even such a manufacturing method can achieve effects similar to those of the method for manufacturing the semiconductor device 30 and the semiconductor device 30 according to the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In each of the above examples, for example, the resist layer 27a used as a mask in the process of etching the first insulating layer or the second insulating layer is formed, as shown in FIG. 7, in a grid-like shape along the dicing line D. However, the resist layer may not necessarily be formed as described above. A modification of the resist layer will be described below.

Figure 21:
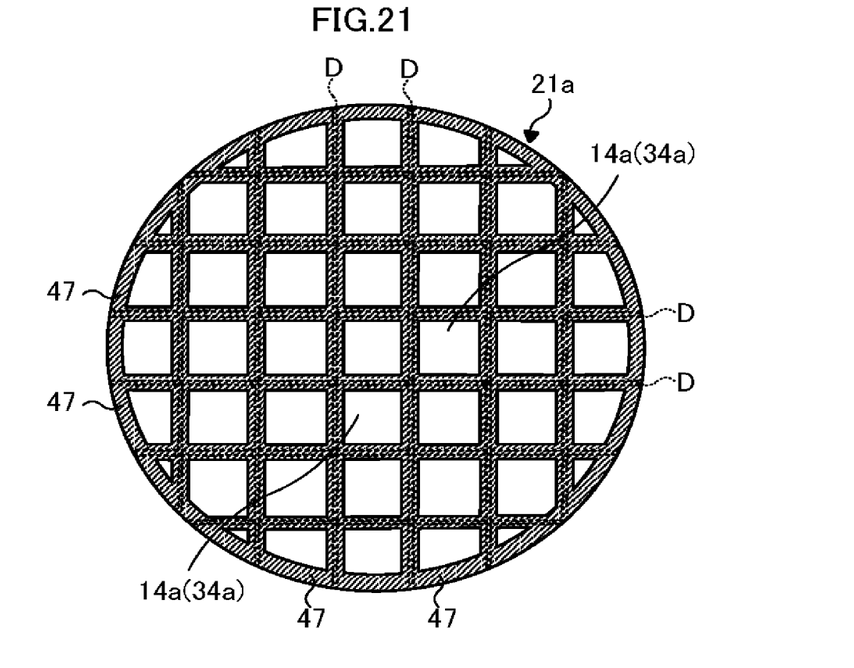
FIG. 21 is a plan view when the first semiconductor wafer in which a resist layer according to a modification is formed is viewed from above.
Figure 22:
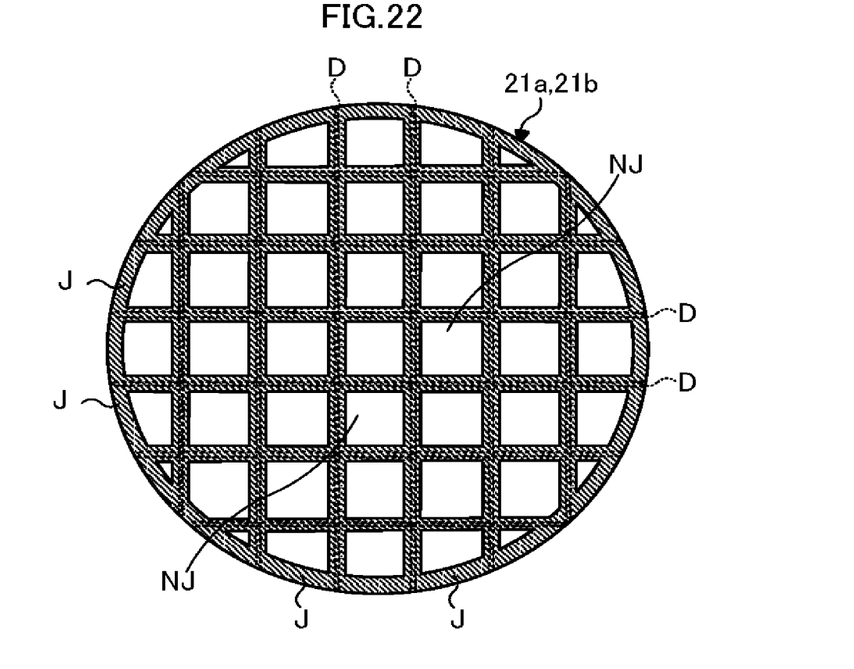
FIG. 22 is a plan view schematically showing the bonded area of the first insulating layer and the second insulating layer and the non-bonded area when a lower layer portion and an upper layer portion are bonded by solid state bonding in the process after the resist layer according to the modification is formed.

FIG. 21 is a plan view when the first semiconductor wafer 21a on which a resist layer 47 according to the modification is formed is viewed from above and FIG. 22 is a plan view schematically showing the bonded area J and the non-bonded area NJ of the first insulating layer and the second insulating layer when the lower layer portion and the upper layer portion are bonded by solid state bonding in a process after the resist layer 47 according to the modification is formed.

As shown in FIG. 21, the resist layer 47 may be provided, in addition to being provided along the dicing line D on the surface of the first insulating layer 14a (34a), further along the circumference of the first semiconductor wafer 21a on the surface of the first insulating layer 14a (34a). When the resist layer 47 is applied to the manufacturing method of a semiconductor device according to the first embodiment, the resist layer 47 is provided, in addition to being provided in a grid shape along the dicing line D, further along the circumference of the second semiconductor wafer 21b on the surface of the second insulating layer 14b. If the resist layer 47 is formed as described above, as shown in FIG. 22, the bonded area J of the first insulating layer 14a (34a) and the second insulating layer 14b (34b) is provided, in addition to being provided in a grid shape along the dicing line D, further along the circumference of the first and second semiconductor wafers 21a, 21b and the non-bonded area NJ of the first insulating layer 14a (34a) and the second insulating layer 14b (34b) is surrounded by the bonded areas J.

Also in the manufacturing method of a semiconductor device manufactured by undergoing the process to form the resist layer 47 according to the modification described above and the semiconductor device, effects similar to those of the methods for manufacturing the semiconductor devices 10, 30 the semiconductor devices 10, 30 according to the above embodiments can be achieved.

In addition to the modification of the resist layer described above, for example, the conductive layer (conductive area constituting the first and second bonded surfaces) projected from the surface of the first and second insulating layers 14a (34a), 14b (34b) by etching these insulating layers 14a (34a), 14b (34b) may be a conductive material other than the through hole conductive materials 16a, 16b, for example, wires.

What is claimed is:

1. A semiconductor device comprising:
a first silicon substrate,
a second silicon substrate,
a first interconnection layer disposed between the first silicon substrate and the second silicon substrate, the first interconnection layer including a first wiring, a plurality of first through-hole conductors containing a plurality of first convex portions and a first silicon oxide layer containing a first non-contact surface including a concaved area surrounding the plurality of first convex portions and a first contact surface including an area surrounding the first non-contact surface, the plurality of first convex portions protruded from the first non-contact surface,
a second interconnection layer disposed between the second silicon substrate and the first interconnection layer, the second interconnection layer including a second wiring, a plurality of second through-hole conductors containing a plurality of second convex portions, and a second silicon oxide layer containing a second non-contact surface including a concaved area surrounding the plurality of second convex portions, and a second contact surface including an area surrounding the second non-contact area, the plurality of second convex portions protruded from the second non-contact surface, wherein
the first wiring is disposed within the first silicon oxide layer without becoming disposed at least on the first non-contact surface, and the first wiring is in contact with the plurality of first through-hole conductors,
the second wiring is disposed within the second silicon oxide layer without becoming disposed at least on the second non-contact surface, and the second wiring is in contact with the plurality of second through-hole conductors,
the first contact surface and the second contact surface are bonded directly to each other by wafer-wafer bonding,
the concaved areas of the first non-contact surface and second non-contact surface form a space, and
the plurality of first convex portions of the plurality of first through-hole conductors and the plurality of second convex portions of the plurality of second through-hole conductors are bonded to each other inside the space.

2. The semiconductor device according to claim 1, wherein the first non-contact surface of the first silicon oxide layer is apart from a surface of the second silicon oxide layer.

3. The semiconductor device according to claim 2, wherein the first non-contact surface is surrounded by a bonded surface of the first silicon oxide layer.

4. The semiconductor device according to claim 1, wherein the plurality of first through-hole conductors and the plurality of second through-hole conductors are bonded by a metallic bond, and the first silicon oxide layer and the second silicon oxide layer are bonded by a covalent bond.

* * * * *